United States Patent
Evans et al.

(10) Patent No.: US 10,081,861 B2
(45) Date of Patent: Sep. 25, 2018

(54) SELECTIVE PROCESSING OF A WORKPIECE

(71) Applicant: Varian Semiconductor Equipment Associates, Inc., Gloucester, MA (US)

(72) Inventors: Morgan D. Evans, Manchester, MA (US); Daniel Distaso, Merrimac, MA (US); Stanislav S. Todorov, Topsfield, MA (US); Mark R. Amato, South Hamilton, MA (US); William Davis Lee, Newburyport, MA (US); Jillian Reno, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 12 days.

(21) Appl. No.: 14/681,762

(22) Filed: Apr. 8, 2015

(65) Prior Publication Data

US 2016/0298229 A1 Oct. 13, 2016

(51) Int. Cl.
| | | |
|---|---|---|
| *B44C 1/22* | (2006.01) | |
| *C03C 15/00* | (2006.01) | |
| *C03C 25/68* | (2006.01) | |
| *C23F 1/00* | (2006.01) | |
| *H01L 21/302* | (2006.01) | |
| *H01L 21/461* | (2006.01) | |
| *C23C 14/48* | (2006.01) | |
| *C23C 14/22* | (2006.01) | |
| *H01J 37/32* | (2006.01) | |

(52) U.S. Cl.
CPC ............ *C23C 14/48* (2013.01); *C23C 14/221* (2013.01); *H01J 37/32385* (2013.01)

(58) Field of Classification Search
CPC ...................................................... C23C 14/48
USPC .......................................................... 216/66
See application file for complete search history.

(56) References Cited

U.S. PATENT DOCUMENTS

| | | | | |
|---|---|---|---|---|
| 5,343,047 A | * | 8/1994 | Ono .................... | H01J 37/3171 250/251 |
| 6,323,497 B1 | * | 11/2001 | Walther ................ | H01J 37/304 250/492.1 |
| 6,605,479 B1 | * | 8/2003 | Pasadyn ................. | H01L 22/20 257/E21.525 |
| 2002/0014407 A1 | * | 2/2002 | Allen .................... | H01J 37/317 204/298.36 |
| 2003/0153104 A1 | * | 8/2003 | Rangarajan ............. | H01L 22/26 438/14 |

(Continued)

*Primary Examiner* — Thomas T Pham
(74) *Attorney, Agent, or Firm* — Nields, Lemack & Frame, LLC

(57) ABSTRACT

Methods for the selective processing of the outer portion of a workpiece are disclosed. The outer portion is processed by directing an ion beam toward the workpiece, where the ion beam extends beyond the outer edge of the workpiece at two locations. The workpiece is then rotated relative to the ion beam about the center so that all regions of the outer portion are exposed to the ion beam. The workpiece may be rotated an integral number of rotations. The ion beam may perform any process, such as ion implantation, etching or deposition. The outer portion may be an annular ring having an outer diameter equal to that of the workpiece and having a width of 1 to 30 millimeters. The rotation of the workpiece may be aligned with a notch on the outer edge of the workpiece.

10 Claims, 6 Drawing Sheets

(56) References Cited

U.S. PATENT DOCUMENTS

| | | | | |
|---|---|---|---|---|
| 2004/0014305 | A1* | 1/2004 | Haselden | H01L 21/31116 438/585 |
| 2006/0252217 | A1* | 11/2006 | Rouh | H01L 21/265 438/369 |
| 2006/0281310 | A1* | 12/2006 | Smith | C23C 16/4584 438/680 |
| 2008/0067434 | A1* | 3/2008 | Walther | H01J 37/3026 250/492.21 |
| 2008/0213990 | A1* | 9/2008 | Oh | H01L 21/28052 438/595 |
| 2010/0006940 | A1* | 1/2010 | Kakehata | H01L 21/76254 257/347 |
| 2014/0235042 | A1* | 8/2014 | Ninomiya | C23C 14/48 438/514 |

\* cited by examiner

SELECTIVE PROCESSING OF A WORKPIECE

Embodiments of the present disclosure relate to a method of selectively processing a workpiece, and more particularly, to selectively processing an outer portion of a semiconductor workpiece.

BACKGROUND

Improvement in yields for semiconductor devices is a continuous goal. One area that may be improved is process uniformity across the workpiece in the radial direction. In certain processes, the workpiece may receive more treatment near the center of the workpiece.

For example, a deposition process may deposit more material near the center of a workpiece than near the outer edge of that workpiece. This may be due to the increased plasma density near the center of the deposition chamber.

As another example, a heated implant may provide a different dose near the outer edge, since this outer edge of the workpiece may be somewhat cooler than the rest of the workpiece.

In another example, a spin coating process may leave more material near the outer edge of the workpiece, as compared to the center of the workpiece. This may be due to the centripetal force pushing the coating toward the outer edge of the workpiece.

In each of these examples, this process non-uniformity in the radial direction may negatively impact the yield of a semiconductor workpiece. In some cases, efforts are made to improve the uniformity of the process. However, there may be limits to the degree of uniformity that may be achieved.

Therefore, it would be beneficial if there were a method of selectively processing the outer portion of a workpiece. Further, it would be advantageous if this selective processing improved the overall process uniformity of the workpiece.

SUMMARY

Methods for the selective processing of the outer portion of a workpiece are disclosed. The outer portion is processed by directing an ion beam toward the workpiece, where the ion beam extends beyond the outer edge of the workpiece at two locations. The workpiece is then rotated relative to the ion beam about the center so that all regions of the outer portion are exposed to the ion beam. The workpiece may be rotated an integral number of rotations. The ion beam may perform any process, such as ion implantation, etching or deposition. The outer portion may be an annular ring having an outer diameter equal to that of the workpiece and having a width of 1 to 30 millimeters. The rotation of the workpiece may be aligned with a notch on the outer edge of the workpiece.

In one embodiment, a method of processing a workpiece is disclosed. The method comprises directing an ion beam toward the workpiece, where the ion beam extends beyond an outer edge of the workpiece at two locations; and rotating the workpiece about a center while the ion beam is directed toward the workpiece, so as to process an outer portion of the workpiece. In certain embodiments, the method may be used to implant ions, etch material or deposit material on the outer portion. In certain embodiments, the directing and rotating are performed on the workpiece to compensate for non-uniformity of a different process performed on the workpiece.

In another embodiment, a method of processing a workpiece is disclosed. The method comprises rotating the workpiece while a ribbon ion beam is directed toward the workpiece, where the ribbon ion beam extends beyond an outer edge of the workpiece at two locations, so as to process an outer portion of the workpiece, the outer portion being an annular ring having an outer diameter equal to a diameter of the workpiece and a width that is less than a radius of the workpiece. In certain embodiments, the workpiece is rotated at a constant speed so as to uniformly process the outer portion of the workpiece. In other embodiments, a speed of rotation of the workpiece is varied during the rotating, so as to preferentially process one region of the workpiece. In certain embodiments, at least one operating parameter is varied during the rotating, so as to preferentially process one region of the workpiece.

In another embodiment, a method of processing a workpiece is disclosed. The method comprises directing an ion beam toward the workpiece, where the ion beam extends beyond an outer edge of the workpiece at two first locations; rotating the workpiece about a center while the ion beam is directed toward the workpiece, so as to process a first outer portion of the workpiece, the first outer portion being an annular ring having an outer diameter equal to a diameter of the workpiece and a first width; directing the ion beam toward the workpiece, after the rotating, where the ion beam extends beyond an outer edge of the workpiece at two second locations, different than the two first locations; and rotating the workpiece about a center while the ion beam is directed toward the workpiece, so as to process a second outer portion of the workpiece the second outer portion being an annular ring having an outer diameter equal to a diameter of the workpiece and a second width, different than the first width. In certain embodiments, a first process is performed on the first outer portion, wherein the first process is selected from the group consisting of deposition, etching and ion implantation. In certain embodiments, a second process is performed on the second outer portion, wherein the second process is selected from the group consisting of deposition, etching and ion implantation. In some embodiments, the first process and the second process are the same. In other embodiments, the first process and the second process are different.

BRIEF DESCRIPTION OF THE FIGURES

For a better understanding of the present disclosure, reference is made to the accompanying drawings, which are incorporated herein by reference and in which:

FIG. 3 is an ion implantation system in accordance with another embodiment that may be used to perform the selective processing of FIG. 1a;

DETAILED DESCRIPTION

As described above, processes are often non-uniform along the radial direction, leading to different characteristics across the semiconductor workpiece. Further, in certain processes, elimination of this non-uniformity may be difficult. For example, deposition processes may deposit more material near the center of the workpiece, due to increased plasma density in this region. Creation of a plasma that is completely uniform across the workpiece in the radial direction may be challenging.

Therefore, it may be advantageous to develop a method of selectively processing the outer portion of a workpiece. In some embodiments, this selective processing may to be to compensate for a known process non-uniformity. For example, in the above deposition example, the selective processing may be used to deposit additional material along the outer portions of the workpiece. In other embodiments, this selective processing may be used to counteract the known process non-uniformity. For example, a certain process may treat the outer portion of the workpiece to a greater extent than the center of the workpiece. In this scenario, the selective processing may be a different process, which counteracts the effect of the first process. For example, if a deposition process deposited more material near the outer portion of the workpiece, a selective etching process may be used to remove material from the outer portion, creating a more even deposition layer.

Of course, deposition is not the only process which may be non-uniform. Ion implantation and etching processes may also possess a certain degree of non-uniformity along the radial direction.

This selective processing serves to treat only the outer portion of the workpiece. The outer portion may be an annular ring, where the outer dimension of that annular ring is the circumference of the workpiece. For example, if the workpiece has a diameter of 300 mm, the annular ring may have an outer diameter of 300 mm and an inner diameter that is somewhat less than 300 mm. The annular ring may be tens of millimeters in width, or may be only a few millimeters. In other words, the width of the annular ring may vary and is not limited by this disclosure.

Figure 1A:
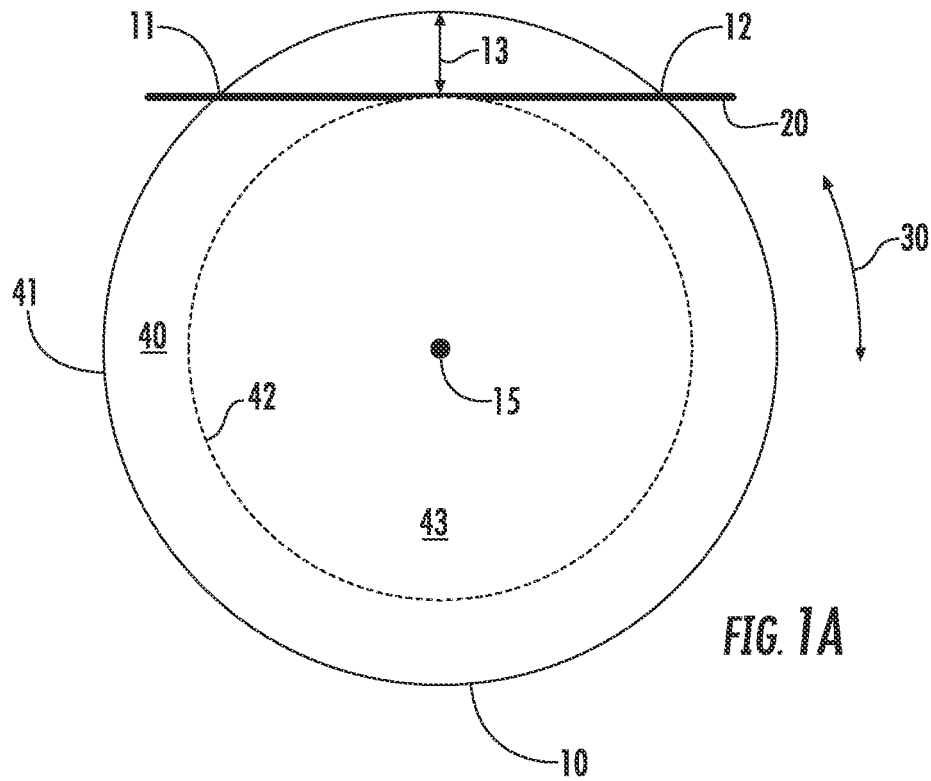
FIG. 1A shows an embodiment of the selective processing of the outer portion of a workpiece.
Figure 1B:
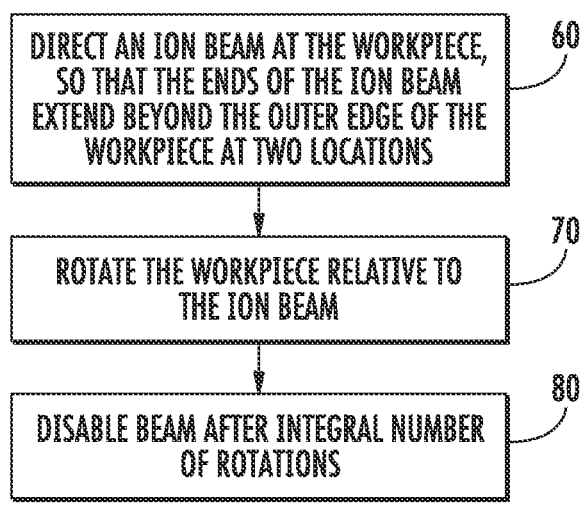
FIG. 1B shows a flowchart that may be used for selective processing of the outer portion of a workpiece.

FIG. 1A shows an embodiment of the selective processing used to treat the outer portion of the workpiece 10. FIG. 1B shows a flowchart corresponding to this selective processing. In this embodiment, an ion beam 20 is directed toward the workpiece 10, such that the ion beam 20 extends across the workpiece 10, forming the geometric line referred to as a chord. The ion beam 20 may be a ribbon ion beam, having a length which is much greater than its width. For example, the length of the ion beam 20 may be several hundred millimeters, while the width of the ion beam 20 may be about ten millimeters. The ion beam 20 may be straight along the length direction. Of course, other dimensions may also be used and are within the scope of the disclosure.

The ion beam 20 extends beyond the workpiece 10 at two locations 11, 12 in the length direction. In some embodiments, the distance between the two locations 11, 12 is less than the overall length of the ion beam 20. In some embodiments, the ion beam 20 may have some non-uniformity near the outer edges in the length direction. Thus, by using the portion of the ion beam 20 between the two locations 11, 12, this non-uniformity of the ion beam 20 may be avoided.

Because, the ion beam is straight and the outer edge of the workpiece is arced, he distance between the ion beam 20 and the outer edge of the workpiece 10 varies. The ion beam 20 is disposed a maximum distance 13 from the outer edge of the workpiece 10. This maximum distance 13 occurs at the midpoint between the two locations 11, 12 and is measured perpendicular to the longer dimension of the ion beam 20. This maximum distance 13 is less than the radius of the workpiece 10. In some embodiments, the maximum distance 13 is much less than the radius of the workpiece 10. For example, in some embodiments, the maximum distance 13 may be between 1 and 30 mm. Further, the maximum distance 13 and the circumference of the workpiece 10 define the outer portion that will be selectively processed. This outer portion 40 is an annular ring having an outer diameter 41 equal to the diameter of the workpiece 10 and an inner diameter 42 equal to the diameter of the workpiece 10, less two times the maximum distance 13. In other words, the outer portion 40 is an annular ring having a width equal to the maximum distance 13 and an outer diameter equal to the diameter of the workpiece 10. Thus, in some embodiments, the annular ring has a width of between 1 and 30 mm. In certain embodiments, the annular ring has a width less than the radius of the workpiece 10.

As shown in FIG. 1B, the ion beam 20 is directed at the workpiece 10, so that the ends of the ion beam 20 extend beyond the outer edge of the workpiece 10 at two locations, as shown in Process 60. Once the ion beam is directed toward the workpiece 10, the workpiece 10 is then rotated about the center 15 in direction 30, as shown in Process 70. The workpiece 10 may be rotated an integral number of complete rotations, or n * 360°, where n is the target number of rotations. The workpiece 10 may be rotation at any suitable rotational speed, such as about 50 seconds per rotation. As the workpiece 10 is rotated in direction 30, a different region of the outer portion 40 is exposed to the ion beam 20. After each complete rotation, all regions of the outer portion 40 will be equally exposed to the ion beam 20. Meanwhile the inner portion 43 of the workpiece 10, which is a circle, having center 15 and an outer diameter that is equal to the inner diameter 42 of the outer portion 40, is not exposed to the ion beam 20 at all. The speed and number of rotations determines the amount of processing that the outer portion 40 receives. After the target number of rotations have been completed, the ion beam is disabled, as shown in Process 80.

The selective processing of the outer portion 40 of the workpiece 10 may be performed using any suitable ion beam implantation system.

Figure 2:
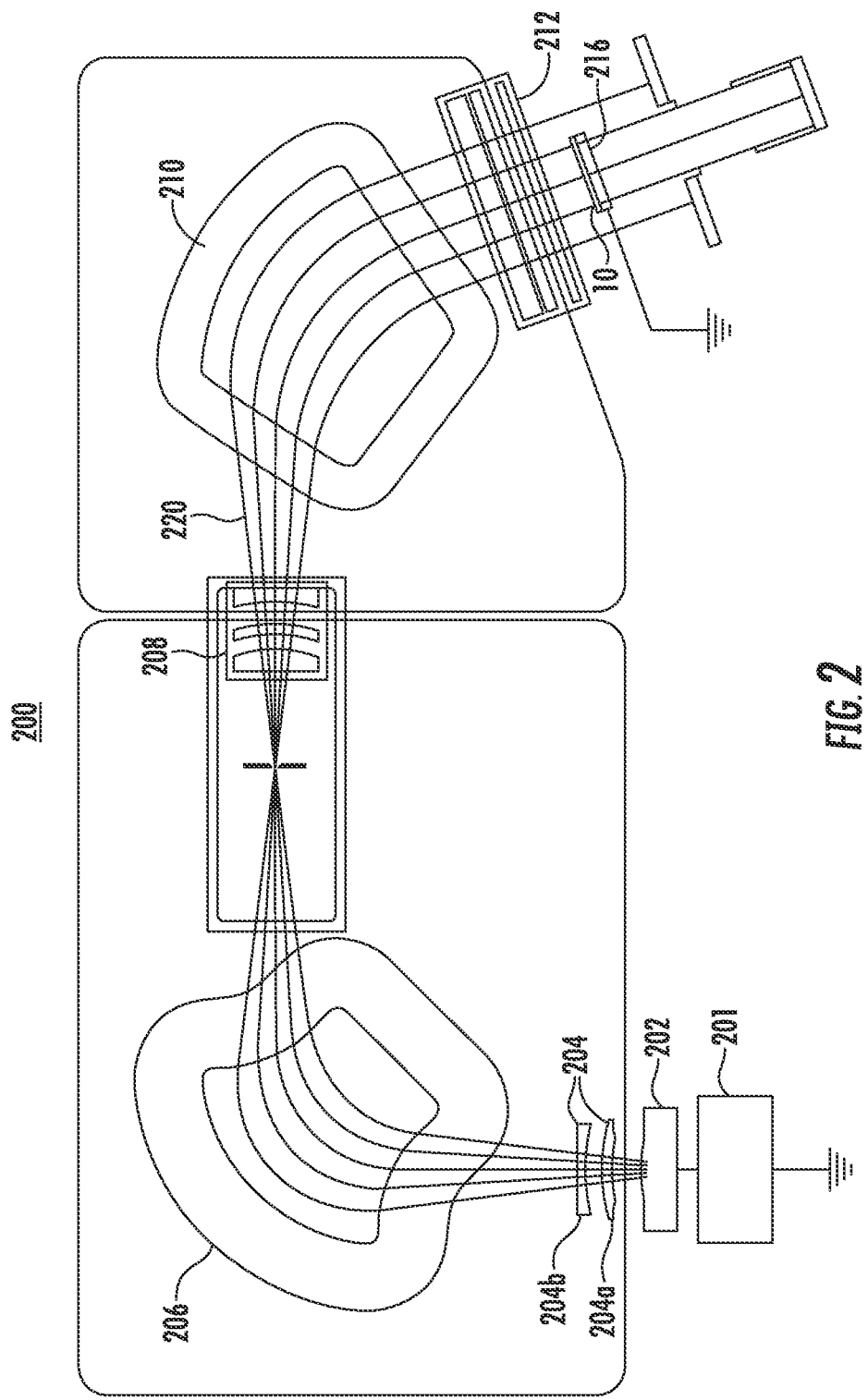
FIG. 2 is an ion implantation system in accordance with one embodiment that may be used to perform the selective processing of FIG. 1A.

FIG. 2 shows a beamline ion implantation system 200 that may be used to perform the selective processing of the outer portion 40. As illustrated in the figure, the beamline ion implantation system 200 may comprise an ion source and a complex series of beam-line components through which an ion beam 220 passes. The ion source may comprise an ion source chamber 202 where ions are generated. The ion source may also comprise a power source 201 and an extraction electrode 204 disposed near the ion source chamber 202. The extraction electrodes 204 may include a suppression electrode 204a and a ground electrode 204b. Each of the ion source chamber 202, the suppression electrode 204a, and the ground electrode 204b may include an aperture. The ion source chamber 202 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 202 may pass through, toward the beam-line components.

The beamline components may include, for example, a mass analyzer 206, a first acceleration or deceleration (A1 or D1) stage 208, a collimator 210, and a second acceleration or deceleration (A2 or D2) stage 212. Much like a series of optical lenses that manipulate a light beam, the beamline components can filter, focus, and manipulate ions or ion beam 220. The ion beam 220 that passes through the beamline components may be directed toward the workpiece 10 that is mounted on a platen 216 or clamp. The workpiece 10 may be moved in one or more dimensions by an apparatus, sometimes referred to as a "roplat." The roplat may be configured to rotate the workpiece 10 about the center of the workpiece, as shown in FIG. 1A. Further, the roplat may be configured to move the workpiece 10 so that the ion beam 220 is directed to a specific region of the workpiece, such as is shown in FIG. 1A.

Figure 3:
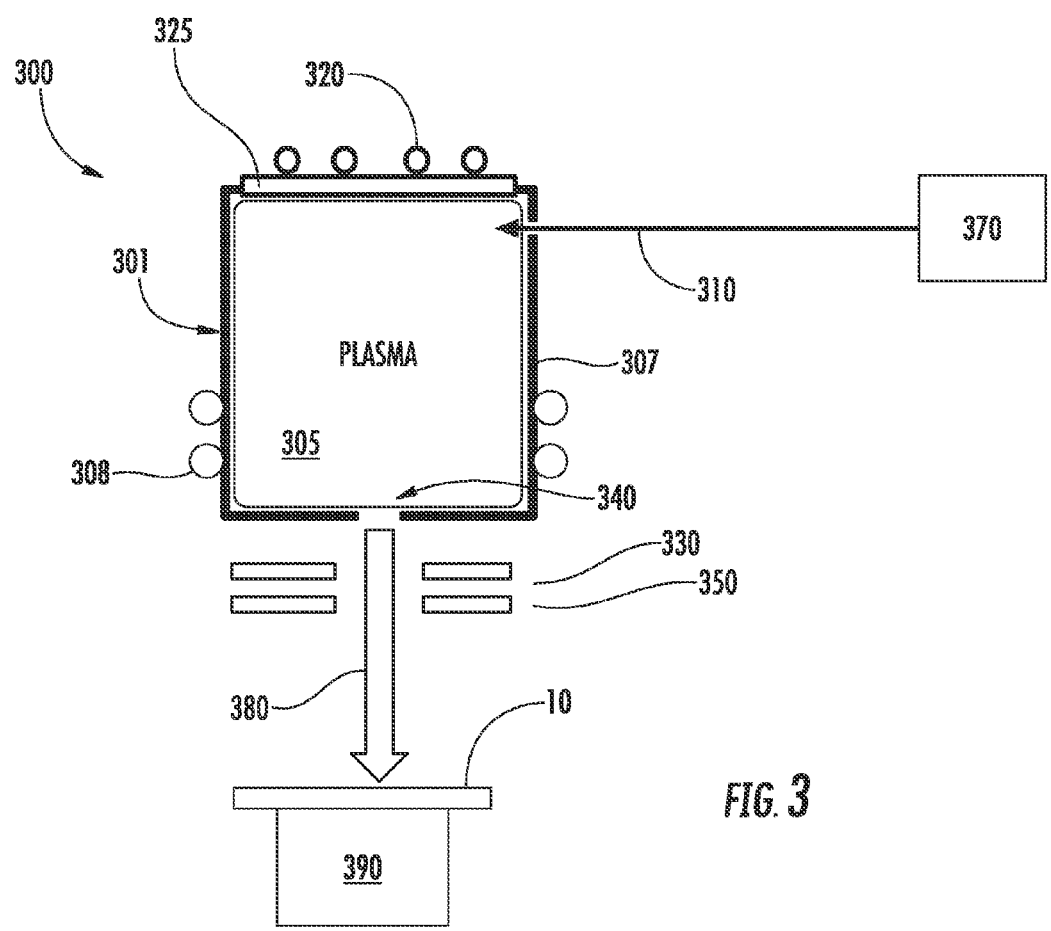

FIG. 3 shows another embodiment of an ion implantation system 300 that may be used to perform the selective processing of the outer portion 40. There is an ion source 301. This ion source 301 includes a plasma chamber 305 defined by plasma chamber walls 307, which may be constructed from graphite or another suitable material. This plasma chamber 305 may be supplied with one or more source gasses, stored in one of more source gas containers, such as a source gas container 370, via a gas inlet 310. This source gas may be energized by an RF antenna 320 or another plasma generation mechanism. The RF antenna 320 is in electrical communication with a RF power supply (not shown) which supplies power to the RF antenna 320. A dielectric window 325, such as a quartz or alumina window, may be disposed between the RF antenna 320 and the interior of the ion source 301. The ion source 301 also includes an aperture 340 through which ions may pass. A negative voltage is applied to extraction suppression electrode 330 disposed outside the aperture 340 to extract the positively charged ions in the form of an ion beam 380 from within the plasma chamber 305 through the aperture 340 and toward the workpiece 10. A ground electrode 350 may also be employed. In some embodiments, the aperture 340 is located on the side of the ion source 301 opposite the side containing the dielectric window 325.

Additionally, electromagnets 308 may be disposed around the plasma chamber walls 307. These electromagnets 308 may be used to manipulate the plasma within the plasma chamber 305, so as to alter the shape or density of the ion beam 380 extracted from the plasma chamber 305.

The workpiece 10 may be disposed on a platen 390, which is capable of rotation, and linear motion. The platen 390 may be configured to rotate as shown in FIG. 1A.

Figure 4:
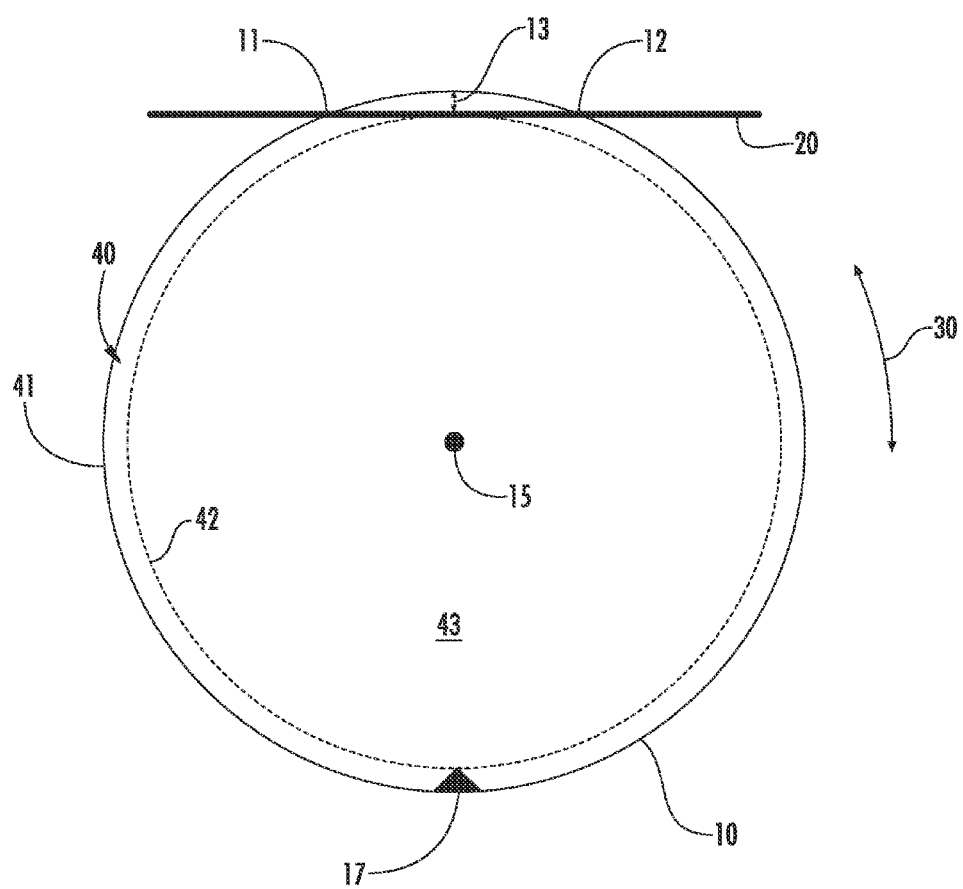
FIG. 4 shows another embodiment of the selective processing of the outer portion of the workpiece.

FIG. 4 shows another embodiment of the selective processing method. In this figure, many of the components are the same as in FIG. 1 and have been given identical reference numbers.

In this embodiment, the maximum distance 13 may be very small, such as less than 5 millimeters. In certain embodiments, workpieces are processed with an edge exclusion region, which may be the outermost 3 millimeters of the workpiece 10. In one embodiment, the maximum distance 13 is defined so as to process this edge exclusion region. In other words, the outer portion may be an annular ring having a width of 3 millimeters.

In certain embodiments, the workpiece 10 may include a notch 17, which may be used for alignment. In certain embodiments, the maximum distance 13 may be defined such that notch 17 may extend into the workpiece at least a distance equal to the maximum distance 13. In other words, the notch 17 serves to completely sever the outer portion 40 so that outer portion 40 is no longer an annular ring.

In this embodiment, the rotation of the ion beam 20 may begin and end at the notch 17. In this way, any overlap or discontinuity created at the end of the rotation, which is referred to as a "stitch", is hidden by the notch 17. Thus, in this embodiment, the ion beam is first directed at the workpiece 10 so as to expose the notch 17. The workpiece 10 is then rotated one or more times, such that the rotation ends at the notch 17. In this way, if a stitch were to occur, the stitch would exist in the region that is cut out by the notch 17. Thus, the entirety of the outer portion 40 would be equally exposed to the ion beam 20.

While the above description discloses the rotation of the workpiece 10, it is also possible that the workpiece 10 remains fixed in place, and the ion beam 20 moves. Thus, rotation of the workpiece 10 relative to the ion beam 20, no matter how accomplished, creates the selective processing of the outer portion 40.

Figure 5A:
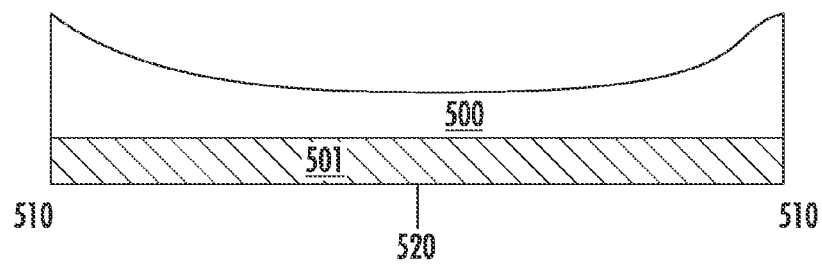
FIG. 5A-C show side views of workpieces before selective processing, after a single selective process and after multiple selective processes, respectively.
Figure 5B:
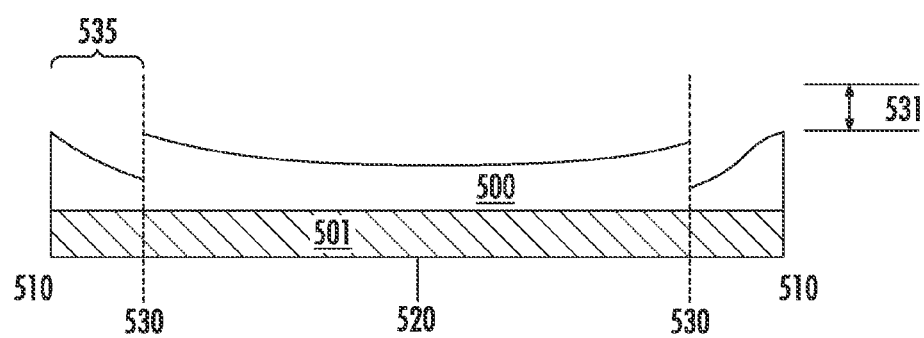
Figure 5C:
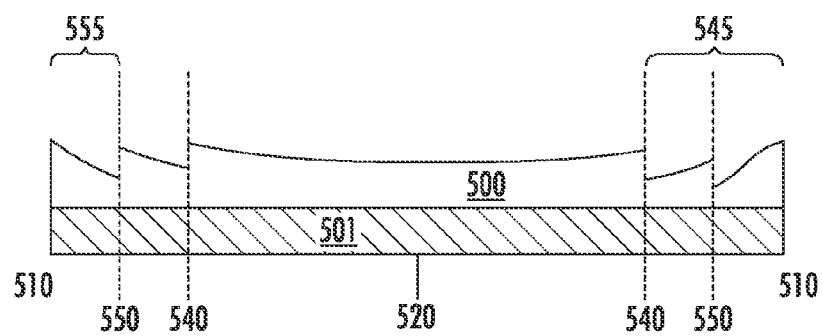

FIGS. 5A-C show the results of a representative selective processing of the outer portion. FIG. 5A shows a workpiece 501 that has been deposited during a previous process. The thickness of the deposited layer 500 is greater near the outer edge 510 of the workpiece 10 than near the center 520. The non-uniformity of the deposited layer 500 has been exaggerated to better illustrate the effects of the selective processing. Based on the thickness profile of the deposited layer 500, a selective etching process may be performed along the outer portion of the workpiece 501.

FIG. 5B shows the workpiece 501 following the selective processing of the outer edge. In this example, the maximum distance was defined as line 530. Thus, the portion of the workpiece 501 further from the center 520 than the line 530 is defined as the outer portion 535, and was subject to the selective processing. The outer portion 535 is an annular ring having an outer diameter equal to the diameter of the workpiece and a thickness equal to the maximum distance. In this example, the selective processing may be an etching process. The workpiece 501 was rotated and etched such that the thickness of the deposited layer 500 at the outer portion 535 of the workpiece 501 was reduced by a thickness 531.

Note that, compared to the original workpiece 501, shown in FIG. 5A, the thickness of the deposited layer 500 is much more even across the workpiece. FIG. 5B shows the resulting workpiece when a single selective process is performed on the outer portion 535.

However, other embodiments are also possible. For example, multiple selective processes may be performed on the outer portion. In some embodiments, the maximum distance is varied for each of these selective processes. This also changes the two locations 11, 12 where the ion beam extends beyond the outer edge of the workpiece 501. FIG. 5C shows the workpiece 501 of FIG. 5A, which has undergone two different selective processes. The first selective process was performed using a first maximum distance defined by line 540, where the ion beam extended beyond the outer edge of the workpiece at two first locations. This processes a first outer portion having a thickness equal to this first maximum distance. The second selective process was performed using a second maximum distance defined by line 550, wherein the ion beam extended beyond the outer edge of the workpiece at two second locations. This processes a second outer portion having a thickness equal to this second maximum distance. In other words, the first selective process processes the first outer portion 545 of the workpiece 501 which is further from the center 520 than line 540. The second selective process processes the second outer portion 555 of the workpiece 501 which is further from the center 520 than line 550. Note that the second outer portion 555 is treated by both selective processes, while the region between line 540 and line 550 is only treated by the first selective process. Thus, the processing of the workpiece 501 may be further refined by performing multiple selective processes. Note that the use of two selective processes further improves the uniformity of the deposited layer 500. Of course, more than two selective processes may be used and the number is not limited by this disclosure.

Further, the two selective processes may differ in various operating parameters. As described above, one difference may be a change in the maximum distance. Other operating parameters that may be varied include the number of rotations, and the rotational speed. Of course, the parameters of the ion beam may also be changed for each selective process.

Figure 6:
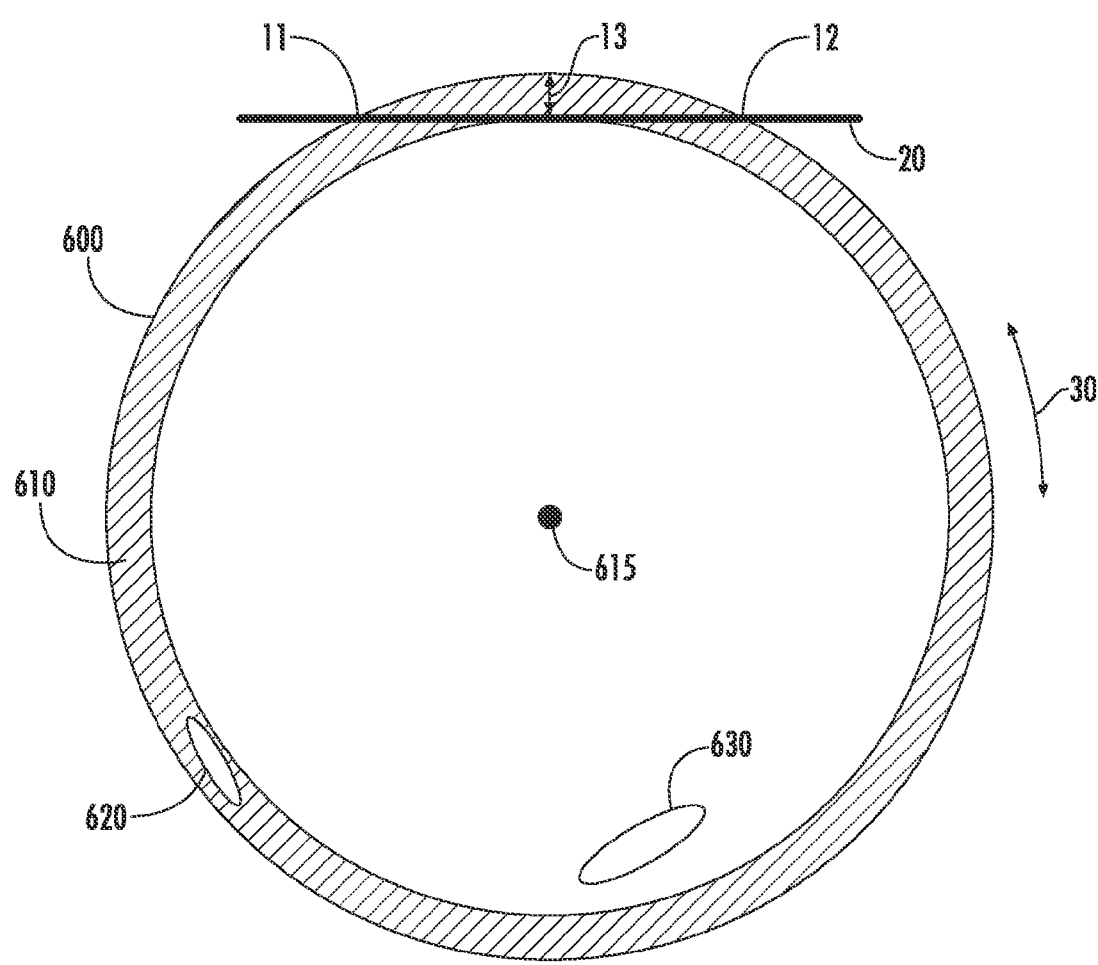
FIG. 6 shows another embodiment of the selective processing of the outer portion of the workpiece.

FIG. 5A-C illustrated a method of uniformly processing the outer portion of the workpiece 600. However, other embodiments are also possible. For example, FIG. 6 shows a workpiece 600 where the non-uniformity is not strictly a function of radial direction. In FIG. 6, the outer portion 610 may have a deposited layer that is thicker than the rest of the workpiece 600, similar to the workpiece 501 in FIG. 5A. Additionally, there may be discrete regions, which are not strictly a function of radial direction, which also have a deposited layer that is thicker than the deposited layer on the rest of the workpiece 600. In this example, discrete region 620 is disposed wherein the outer portion 610 of the workpiece. However, discrete region 630 is disposed closer to the center 615 of the workpiece 600 and is not within the outer portion 610. These discrete regions 620, 630 may be created due to non-uniformities within the chamber, such as the non-uniform effects of pumping. While FIG. 6 shows discrete regions where the deposited layer is thicker, it is also possible that discrete regions, where the deposited layer is thinner may also be created.

As described above, the ion beam may extend beyond the outer edge of the workpiece 600 in two locations 11, 12 and have a maximum distance 13 from the outer edge of the workpiece 600. The method shown in FIG. 2 may be used to correct these non-uniformities. For example, the outer portion 610 may be treated using the technique described above with respect to FIG. 5B or 5C.

The discrete region 630 may also be treated using a modification of the previously disclosed technique. Specifically, the previous examples used a constant rotational speed, with a constant ion beam current during the processing of the outer portion. In this example, discrete region 630 may be processed by modifying one or more of operating parameters. For example, in one embodiment, the workpiece 600 is rotated at a first speed when the discrete region 630 is exposed to the ion beam 20. The workpiece 600 is then rotated at a second speed, faster than the first speed, when the discrete region 630 is not exposed to the ion beam 20. This minimizes the effect of the ion beam on other regions of the workpiece 600 while treating the discrete region 630. In another embodiment, the magnitude of the ion beam current may be modified as the workpiece 600 is rotated. The ion beam 20 may be operated at a first duty cycle, such as 100%, when the discrete region 630 is exposed to the ion beam 20. The ion beam may then operate at a second duty cycle, less than the first duty cycle, when the discrete region 630 is not exposed to the ion beam 20.

Of course, other parameters may also be modified to more preferentially treat the discrete region 630 than the rest of the workpiece 600. These parameters include, but are not limited to ion beam current, ion beam shape, ion beam density profile, gas flow in an ion source, and ion composition of the ribbon ion beam. In certain embodiments, the shape or ion density profile of the ion beam may be manipulated while the workpiece 600 is being rotated. FIG. 2 shows a beamline ion implantation system 200, where the beam-line components can manipulate the ion beam 220. FIG. 3 shows another embodiment of an ion implantation system 300. In this embodiment, the shape or ion density profile of the ion beam 380 may be manipulated by actuating the electromagnets 308 disposed on the plasma chamber walls 307.

FIG. 6 also shows a discrete region 620 disposed within the outer portion 610. In one embodiment, the outer portion 610 is treated, as described with respect to FIGS. 5B and 5C. This selective processing will reduce the thickness of the deposited on the discrete region 620, as discrete region 620 is part of the outer portion 610. After the outer portion 610 has been processed, the discrete region 620 may be treated, as described above with respect the discrete region 630. Of course, in another embodiment, the discrete region 620 may be processed before the outer portion 610.

In another embodiment, the selective processing of the outer portion 610 and the discrete region 620 are performed simultaneously, using the procedure described above with respect to discrete region 630. Specifically, the rotation speed of the workpiece 600 may be slowed to a first speed while the discrete region 620 is exposed to the ion beam 20, and then increased to a second speed for other parts of the outer portion 610. The difference between the first speed and the second speed may be less than the difference between the speeds used to process discrete region 630. This allows the discrete region 630 to be processed more than the outer portion 610, while still processing the outer portion 610 to a somewhat lesser extent.

Note that while these examples describe a scenario involving deposition and one or more selective etching processes, other scenarios are also possible. The selective process may be an ion implantation process, an etching process or a deposition process. Similarly, the process performed before the selective processing may also be any of these processes.

Additionally, FIGS. 5A-C and 6 describe a scenario where the selective processing of the outer portion occurs after a non-uniform process, such as a deposition process. This may be referred to as post-compensation. However, other embodiments are also possible. For example, the selective processing of the outer portion may occur prior to the non-uniform process. This may be referred to as pre-compensation.

The embodiments described above in the present application may have many advantages. As described above, many semiconductor processes exhibit some non-uniformity along the radial direction. The methods described herein provide a way to selective process the outer portion of the workpiece to compensate for or counteract these non-uniformities. Further, the selective processing described herein may be performed a plurality of times, allowing further refinement, which may result in improved uniformity.

In addition, the ability to selectively process the outer portion of the workpiece may allow other semiconductor processes to have increased degree of radial non-uniformity. Further, by positioning the ion beam that performs the selective processing such it extends across the workpiece, the uniformity of the selective process may be more tightly controlled.

In summary, the workpiece may be more uniformly processed by the incorporation of the selective processing described herein. Thus, issues, such as increased deposition along the outer edge or reduced ion dose along the outer edge, can be rectified by the present embodiments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
performing a deposition process on the workpiece, wherein a thickness of material deposited is non-uniform;
directing a ribbon ion beam toward the workpiece, after the deposition process, where the ribbon ion beam extends beyond an outer edge of the workpiece at two locations; and
rotating the workpiece at least 360° about a center of the workpiece while the ribbon ion beam is directed toward the workpiece, so as to perform an etching process on only an outer portion of the workpiece, wherein the outer portion is an annular ring having an outer diameter equal to a diameter of the workpiece and a width that is less than a radius of the workpiece, and wherein the etching process removes material and compensates for thickness non-uniformity of the deposition process performed on the workpiece.

2. The method of claim 1, wherein the workpiece is rotated an integral number of rotations.

3. The method of claim 1, wherein the annular ring has a width of between 1 and 30 mm.

4. The method of claim 1, wherein the workpiece comprises a notch along the outer edge, and the ribbon ion beam is directed toward the notch when the rotating begins, and the ribbon ion beam is directed toward the notch when the rotating ends.

5. The method of claim 1, wherein the workpiece is rotated at a constant speed and uniformly processes the outer portion of the workpiece.

6. The method of claim 1, wherein a speed of rotation of the workpiece is varied during the rotating, and preferentially processes one region of the workpiece.

7. The method of claim 1, wherein at least one operating parameter is varied during the rotating, and preferentially processes one region of the workpiece.

8. The method of claim 7, wherein the at least one operating parameter is selected from the group consisting of ion beam current, ion beam duty cycle, ion beam shape, ion beam density profile, gas flow in an ion source, and ion composition of the ribbon ion beam.

9. A method of processing a workpiece, comprising:
performing a deposition process on the workpiece, wherein a thickness of material deposited is non-uniform;
directing a ribbon ion beam toward the workpiece, after the deposition process, where the ribbon ion beam extends beyond an outer edge of the workpiece at two first locations;
rotating the workpiece at least 360° about a center of the workpiece while the ribbon ion beam is directed toward the workpiece, so as to perform a first etching process on only a first outer portion of the workpiece, the first outer portion being an annular ring having an outer diameter equal to a diameter of the workpiece and a first width;
directing the ribbon ion beam toward the workpiece, after the rotating, where the ribbon ion beam extends beyond an outer edge of the workpiece at two second locations, different than the two first locations; and
rotating the workpiece at least 360° about the center while the ribbon ion beam is directed toward the workpiece, so as to perform a second etching process on only a second outer portion of the workpiece, the second outer portion being an annular ring having an outer diameter equal to a diameter of the workpiece and a second width, different than the first width;
wherein the first etching process and the second etching process each remove material and compensate for thickness non-uniformity of the deposition process performed on the workpiece.

10. The method of claim 9, wherein the first width is greater than the second width.

* * * * *